United States Patent
Yang et al.

(10) Patent No.: US 9,383,877 B2
(45) Date of Patent: Jul. 5, 2016

(54) TOUCH SCREEN AND MANUFACTURING METHOD

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Wenjuan Yang, Beijing (CN); Weigang Gong, Beijing (CN); Chengzhu Lu, Beijing (CN); Jiahong Lin, Beijing (CN); Xiaofeng Wang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/362,064

(22) PCT Filed: Dec. 18, 2013

(86) PCT No.: PCT/CN2013/089801
§ 371 (c)(1),
(2) Date: May 30, 2014

(87) PCT Pub. No.: WO2015/010430
PCT Pub. Date: Jan. 29, 2015

(65) Prior Publication Data
US 2015/0253899 A1  Sep. 10, 2015

(30) Foreign Application Priority Data

Jul. 23, 2013  (CN) .......................... 2013 1 0311328

(51) Int. Cl.
*G06F 3/045* (2006.01)
*G06F 3/044* (2006.01)
(Continued)

(52) U.S. Cl.
CPC ............ *G06F 3/044* (2013.01); *C23C 14/0641* (2013.01); *C23C 14/0676* (2013.01);
(Continued)

(58) Field of Classification Search
CPC ........................................................ G06F 3/044
USPC .......................................................... 345/174
See application file for complete search history.

(56) References Cited

U.S. PATENT DOCUMENTS

2009/0244028 A1 * 10/2009  Matsuo ................... G06F 3/044
345/174
2009/0309850 A1   12/2009  Yang
(Continued)

FOREIGN PATENT DOCUMENTS

CN   101989160 A   3/2011
CN   102004595 A   4/2011
(Continued)

OTHER PUBLICATIONS

First Chinese Office Action Appln. No. 201310311328.0: Dated Nov. 30, 2015.
(Continued)

*Primary Examiner* — Jason Olson
(74) *Attorney, Agent, or Firm* — Ladas & Parry LLP

(57) ABSTRACT

Embodiments of the present invention provide a touch screen and a manufacturing method thereof. The touch screen includes: a substrate, a plurality of first electrodes, a plurality of second electrodes and a blanking component. The blanking component at least includes a first blanking layer and a second blanking layer for reducing reflection of external light, wherein, the first blanking layer and the second blanking layer are different in density; the blanking component is arranged between the substrate and the bridging component; and the substrate is arranged between the blanking component and an external environment.

17 Claims, 5 Drawing Sheets

(51) Int. Cl.
*G06F 1/16* (2006.01)
*C23C 14/35* (2006.01)
*C23C 14/06* (2006.01)
*C23C 14/08* (2006.01)

(52) U.S. Cl.
CPC ............. *C23C14/08* (2013.01); *C23C 14/35* (2013.01); *G06F 1/16* (2013.01); *G06F 2203/04103* (2013.01); *G06F 2203/04111* (2013.01)

(56) References Cited

U.S. PATENT DOCUMENTS

| | | | |
|---|---|---|---|
| 2011/0032207 A1 | 2/2011 | Huang et al. | |
| 2012/0081333 A1* | 4/2012 | Ozeki | G06F 3/044 345/174 |
| 2012/0169647 A1* | 7/2012 | Kuo | G06F 3/044 345/174 |
| 2013/0133935 A1 | 5/2013 | Hsu et al. | |
| 2014/0333578 A1* | 11/2014 | Wu | G06F 3/044 345/174 |
| 2015/0036062 A1* | 2/2015 | Chien | G06F 3/0412 349/12 |

FOREIGN PATENT DOCUMENTS

| | | |
|---|---|---|
| CN | 102629176 A | 8/2012 |
| CN | 20632246 U | 12/2012 |
| CN | 102955639 A | 3/2013 |
| CN | 103135837 A | 6/2013 |
| CN | 103412697 A | 11/2013 |

OTHER PUBLICATIONS

International Search Report dated May 9, 2014; PCT/CN2013/089801.
International Preliminary Report on Patentability Appln. No. PCT/CN2013/089801; Dated Jan. 26, 2016.
Second Chinese Office Action dated Apr. 14, 2016; Appln. No. 201310311328.0.

* cited by examiner

TOUCH SCREEN AND MANUFACTURING METHOD

TECHNICAL FIELD

Embodiments of the invention relate to a touch screen and a manufacturing method thereof.

BACKGROUND

In the display technical field, touch screen, as a new input device, has been widely applied in the technical field of touch display screen.

Capacitive touch screen has attracted much attention due to its advantages of rapid response time, high reliability, durable use and the like. The capacitive touch screen, depending on modes of integrating with the display screen, is at least classified into in-cell capacitive touch screen and add-on capacitive touch screen.

According to working principle, the touch screen is divided into a surface capacitive type and a projected capacitive type, and the touch screen of projected capacitive type includes a self-capacitive touch screen and a mutual capacitive touch screen. The touch screen of projected capacitive type is applied relatively wide at present.

Generally, a projected capacitive touch screen comprises a plurality of first electrodes and a plurality of second electrodes arranged in a touch region (or called a pixel region) of a substrate so as to realize a touch function. The respective first electrodes and the respective second electrodes can be arranged in the same layer or in different layers. The first electrodes or the second electrodes arranged in the same layer are disconnected at intersection of the first electrodes and the second electrodes, and the disconnected parts are connected through a bridging component.

Referring to FIG. 1 which is a structural schematic diagram of a current touch screen with the first electrodes and the second electrodes arranged in the same layer, the current touch screen comprises a plurality of first electrodes 101 disposed along a first direction and a plurality of second electrodes 102 disposed along a second direction crossing with the first direction in a touch region on a substrate 100; each of first electrodes 101 is disconnected in each intersection region with the second electrodes 102; the disconnected parts are connected through a bridging component 103, and the bridging component 103 is insulated from the second electrode 102 by an insulating layer 104.

Generally, the bridging component is a transparent conducting wire or a metal wire. The bridging component, which is made of the metal wire, has the characteristics of low cost, simple manufacturing process and low resistivity, and most of current touch screens take metal wire as bridging component to form the touch screens. The metal wire has metallic luster and is relatively high in reflectivity of light from outside of a display panel, so that the bridging component is visible to naked eyes and thus influences the display effect of the touch screen; even if a metal layer with relatively low reflectivity is used as a bridging component, its reflectivity will not be lower than 30%, such that the bridging component cannot achieve an invisibility purpose.

SUMMARY

An embodiment of the present invention provides a touch screen, comprising: a substrate; a plurality of first electrodes extending in a first direction above the substrate; a plurality of second electrodes extending in a second direction above the substrate and disposed to intersect the first electrodes, wherein the first electrode and the second electrode are transparent electrodes; the first electrodes are disconnected into a plurality of first sub-electrodes in intersection regions with the second electrodes, and any two adjacent first sub-electrodes within the same first electrode are electrically connected through a bridging component; the bridging component is insulated from the second electrode by an insulating layer; and a blanking component, at least including a first blanking layer and a second blanking layer for reducing reflection of external light, wherein the first blanking layer and the second blanking layer are different in density; the blanking component is arranged between the substrate and the bridging component; and the substrate is arranged between the blanking component and an external environment.

Another embodiment of the present invention provides a touch screen, comprising: a substrate; a plurality of first electrodes extending in a first direction above the substrate; and a plurality of second electrodes extending in a second direction above the substrate and disposed to intersect the first electrodes; wherein the first electrode and the second electrode are insulated by an insulating layer in an intersection region; at least one of the first electrode and the second electrode includes a first blanking layer and a second blanking layer, for reducing reflection of external light.

In an example, the first blanking layer and the second blanking layer are in direct contact and satisfy formulas (1-1) and (1-2):

$$2n_1 d_1 = (2m_1 - 1)\lambda/2 \qquad (1\text{-}1)$$

$$|2n_1 d_1 - 2n_2 d_2| = (2m_2 - 1)\lambda/2 \qquad (1\text{-}2)$$

wherein, $n_1$ is refractive index of the first blanking layer, $d_1$ is thickness of the first blanking layer, $m_1$ is any positive integer, $n_2$ is refractive index of the second blanking layer, $d_2$ is thickness of the second blanking layer, $m_2$ is any positive integer, and $\lambda$ is wavelength of ambient light.

In an example, the touch screen further comprises a conducting layer in a region corresponding to at least one of the first electrode and the second electrode, so that the at least one of the first electrode and the second electrode is located between the conducting layer and the substrate.

In an example, a projection of the bridging component on the substrate is within a projection of the blanking component on the substrate.

In an example, the second blanking layer is stacked on the first blanking layer, and an area of the first blanking layer is equal to an area of the second blanking layer.

In an example, the bridging component is made from single metal or alloy, preferably molybdenum, aluminum, molybdenum alloy or aluminum alloy.

In an example, the first blanking layer and/or the second blanking layer are/is made from metal oxide, metal nitride, metal oxynitride, alloy oxide, alloy nitride or alloy oxynitride.

In an example, the first blanking layer and/or the second blanking layer are/is made from oxide, nitride or nitrogen oxide of at least one metal contained in the bridging component.

In an example, the second electrode, the insulating layer, the first blanking layer, the second blanking layer and the bridging component are sequentially arranged in above-mentioned order in a direction away from the substrate.

In an example, the first blanking layer, the second blanking layer, the bridging component, the insulating layer and the second electrode are sequentially arranged in above-mentioned order in a direction away from the substrate.

In an example, the blanking component is insulated from the first electrode; and the first blanking layer, the second blanking layer, the second electrode, the insulating layer and the bridging component are sequentially arranged in the above-mentioned order in a direction away from the substrate.

In an example, the first electrode is comprised of a first blanking layer and a second blanking layer; the second electrode is comprised of another first blanking layer and another second blanking layer; and the first blanking layer, the second blanking layer, the insulating layer, the another first blanking layer and the another second blanking layer are sequentially arranged in a direction away from the substrate.

Still another embodiment of the present invention provides a manufacturing method of a touch screen, comprising steps of: forming a plurality of first electrodes and second electrodes disposed to intersect each other on a substrate; disconnecting the first electrodes in regions intersecting with the second electrode to faun a plurality of first sub-electrodes, wherein the first electrodes and the second electrodes are transparent electrodes; forming a bridging layer for connecting any two adjacent first sub-electrodes within the same first electrode on the substrate; sequentially forming a first blanking layer and a second blanking layer in a region corresponding to the bridging layer on the substrate, for reducing reflection of external light.

In an example, the first blanking layer and the second blanking layer are different in density; and the blanking component is arranged between the substrate and the bridging component.

In an example, the forming the first blanking layer and the second blanking layer includes: forming the first blanking layer in a cavity containing oxygen, nitrogen or mixed gas thereof by taking a metal or an alloy as a target material through magnetron sputtering; forming the second blanking layer in a cavity containing oxygen, nitrogen or mixed gas thereof by taking a metal or an alloy as a target material through magnetron sputtering; wherein the gases filled into the cavity for forming the first blanking layer and the second blanking layer are of different types or are of same type but different in ventilation volume when the target materials for forming the first blanking layer and the second blanking layer are same.

Still another embodiment of the present invention provides a manufacturing method of a touch screen, comprising: forming a plurality of first electrodes and second electrodes disposed to intersect each other on a substrate, wherein the first electrode includes at least two stacked blanking layers and/or the second electrode includes at least two stacked blanking layers, and respective stacked blanking layers are different in density and have function of reducing light reflection; forming an insulating layer for insulating the first electrode from the second electrode in an intersection region thereof on the substrate.

In an example, the forming the first electrode includes: sequentially forming the first blanking layer and the second blanking layer on the substrate as the first electrode;

forming an insulating layer on the substrate with the first electrode formed thereon; forming the second electrode on the substrate with the insulating layer formed thereon.

In an example, the forming the second electrode includes sequentially forming the first blanking layer and the second blanking layer as the second electrode.

In an example, the forming the first blanking layer and the second blanking layer includes: forming the first blanking layer in a cavity containing oxygen, nitrogen or mixed gas thereof by taking a metal or an alloy as a target material through magnetron sputtering; forming the second blanking layer in a cavity containing oxygen, nitrogen or mixed gas thereof by taking a metal or an alloy as a target material through magnetron sputtering; wherein the gases filled into the cavity for forming the first blanking layer and the second blanking layer are of different types or are of same type but different in ventilation volume when the target materials for forming the first blanking layer and the second blanking layer are same.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

The technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The embodiments of the present invention provide a touch screen and a manufacturing method thereof and a display device, so as to reduce reflection of external ambient light in a non-transparent component region of the touch screen, thus improving invisibility degree of the non-transparent component region in the touch screen.

A touch screen provided by an embodiment of the present invention comprises a plurality of first electrodes and a plurality of second electrodes, wherein the first electrodes and the second electrodes can be touch driving electrodes and touch sensing electrodes respectively, or can be touch sensing electrodes and touch driving electrodes respectively.

It should be note that all touch screens provided by embodiments of the present invention or touch screen structures shown in the attached drawings are used to explain the invention, but not intended to limit the scope of the invention, i.e., the touch screen structures provided by all the attached drawings of the embodiments of the present invention are several typical touch screen structures for explaining non-transparent bridging component or other conducting layer components provided in the embodiments of the invention; for example, blanking component is arranged in the region of the bridging component or conducting layer when the bridging component or conducting layer is made from metal or alloy. Any touch screen including the blanking component should be included within the scope of the invention.

First Embodiment

Figure 1:
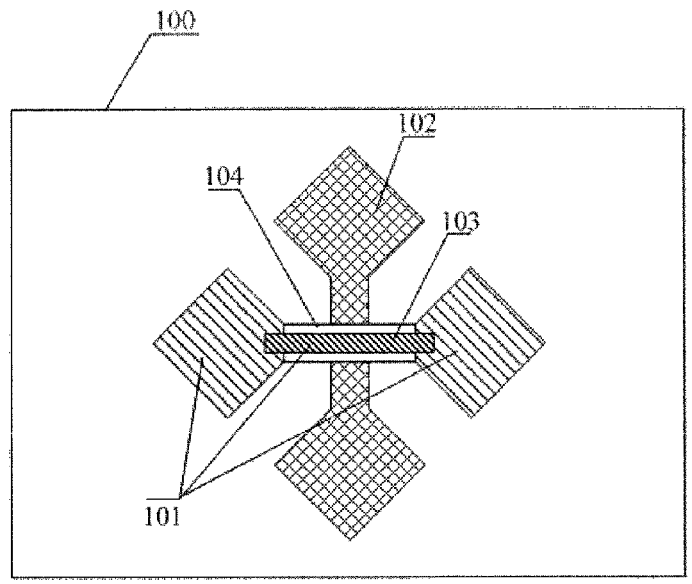
FIG. 1 is a schematic plan view of a current touch screen.
Figure 2:
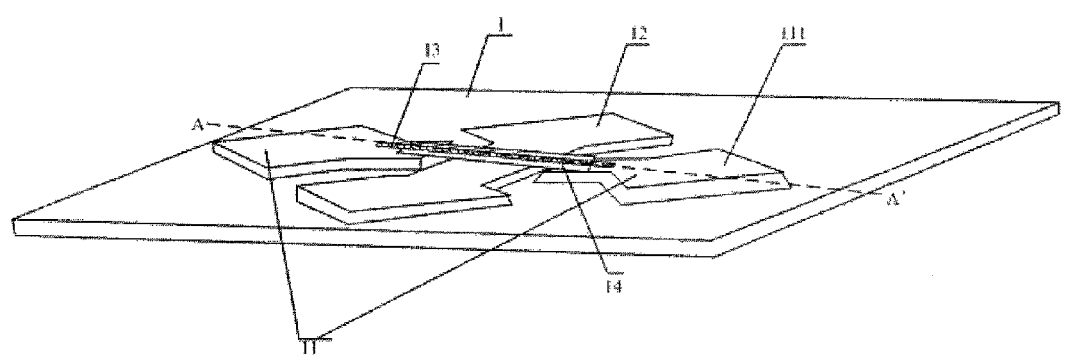
FIG. 2 is a schematic perspective view of a touch screen according to a first embodiment of the present invention.

The first embodiment of the present invention provides a touch screen. The touch screen, as shown in FIG. 2, comprises a substrate 1; a plurality of first electrodes 11 arranged on the substrate 1 in a first direction; and a plurality of second electrodes 12 arranged on the substrate 1 in a second direction (FIG. 2 only shows one first electrode 11 and one second electrode 12); the first electrode 11 and the second electrode 12 which are transparent electrodes are disposed to intersect each other and are insulated with each other; the first electrode 11 is disconnected into a plurality of first sub-electrodes 111 in an intersection region; two adjacent first sub-electrodes 111 are electrically connected through a bridging component 13 which is made of metal or alloy; and the bridging component 13 is insulated from the unbroken second electrode 12 by an insulating layer 14. The touch screen further comprises a blanking component arranged in a region corresponding to the bridging component 13; for example, the blanking component includes at least two blanking layers which are different in density and have function of reducing external light reflection. The respective blanking layers are not shown in FIG. 2.

For example, the blanking layers can be any films with low-reflectivity.

It should be noted that, in the touch screen provided by the embodiment of the present invention, the phrase "a film on the substrate" can be interpreted in two ways.

Referring to FIG. 2, for example, the phrase "the first electrode 11 on the substrate 1" means that the first electrode 11 is in contact with the substrate 1; or the first electrodes 11 is located above the substrate 1 with other functional films arranged therebetween; for example, a buffer layer is arranged between the first electrodes 11 and the substrate 1 so as to improve adhesive force of the first electrode 11 on the substrate 1.

What is meant by "the first electrode and the second electrode are disposed to intersect each other" is that a certain angle (corresponding to an acute angle in a triangle) is formed between the first and the second electrodes; or the first and the second electrodes are perpendicular to each other.

In the touch screen provided by the first embodiment of the present invention, the respective blanking layers are disposed close to an incident plane of external light, and the bridging component is disposed away from the external light incidence surface relative to the blanking component used thereto, i.e., the external light sequentially passes through the blanking layers and the bridging component, so as to reduce reflectivity of the external light. The external light is natural light outside the display panel, which is different from backlight in the display panel.

In the touch screen provided by the first embodiment of the present invention, the respective blanking layers are different in density, and thus are different in reflecting external light. Due to optical destructive interference between different reflected light, reflectivity of the touch screen in corresponding region of the bridging component can be further reduced.

In examples shown in FIG. 3-FIG. 6, the blanking component is comprised of two blanking layers, i.e., the first blanking layer 15 and the second blanking layer 16.

Figure 3:
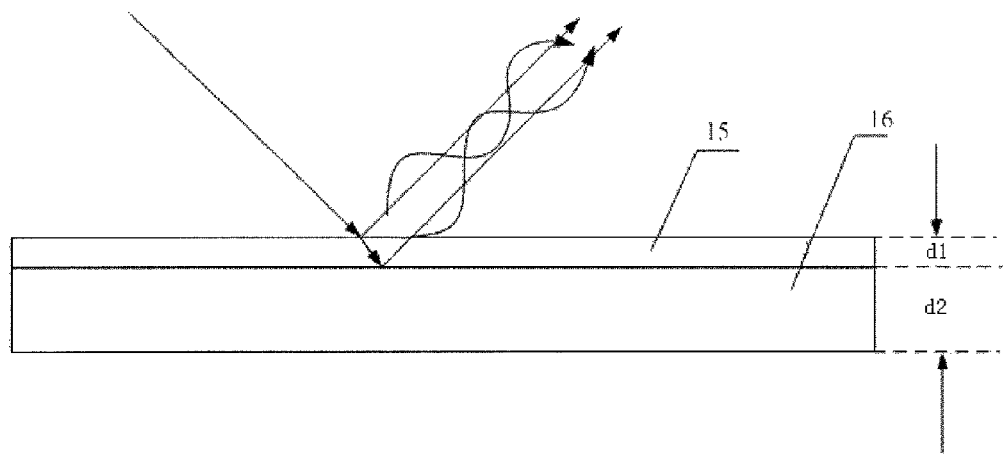
FIG. 3 is a light path diagram of light passing through a blanking layer in the touch screen according to the first embodiment of the present invention.

As shown in FIG. 3 (the substrate above the first blanking layer is not shown), Light, as an electromagnetic wave, when passing through the first blanking layer 15 and the second blanking layer 16, is reflected on both of their surfaces; destructive interference occurs between two beams of reflected light if an optical path difference between the two beams of reflected light is odd times of half-wavelength, so as to further reduce light intensity of the reflected light or even avoid reflected light, thus further improving invisibility degree of the bridging component.

For example, the external light, when passing through the first blanking layer 15 and the second blanking layer 16, satisfies formulas (1-1) and (1-2):

$$2n_1 d_1 = (2m_1 - 1)\lambda/2 \quad (1\text{-}1)$$

$$|2n_1 d_1 - 2n_2 d_2| = (2m_2 - 1)\lambda/2 \quad (1\text{-}2)$$

Wherein $n_1$ represents a refractive index of the first blanking layer, $d_1$ is thickness of the first blanking layer, $m_1$ is any positive integer, $n_2$ represents a refractive index of the second blanking layer, $d_2$ is thickness of the second blanking layer, $m_2$ is any positive integer, and $\lambda$ denotes wavelength of the external light.

Destructive interference occurs between two beams of reflected light to the greatest extent when the formulas (1-1) and (1-2) is satisfied. However the purpose of reducing light reflectivity can be achieved as long as amplitude of the sum of two reflected waves at the same time is no greater than amplitude of one of the two reflected waves.

For example, when material of the first blanking layer 15 is determined, the reflectivity $n_1$ is determined. In this case, the optical path difference $\Delta S_1$ can be adjusted to satisfy formula (1-1) through controlling thickness $d_1$ of the first blanking layer 15 on the premise that wavelength of incident light $\lambda$ in the formula is determined. Of course, the less the thickness $d_1$ of the first blanking layer 15, the better, i.e., it is the best that the thickness of the first blanking layer 15 satisfies $\Delta S = \lambda/2$. In the same way, the optical path difference $\Delta S_2$ can be adjusted to satisfy formula (1-2) by controlling $d_1$, $d_2$, $n_1$ and $n_2$.

In an example, the first blanking layer and the second blanking layer are made from materials selected from groups consisting of the following materials: metal oxide, metal nitride, metal oxynitride, alloy oxide, alloy nitride, alloy oxynitride, etc. The oxide, nitride and oxynitride of metal or alloy are not in metallic color (slightly grey and black) which have excellent light absorption effect, so that light reflected to light emission side of the touch screen is reduced, light reflectivity is reduced and invisibility degree of the bridging component is improved.

According to the first embodiment of the present invention, an insulating layer, a first blanking layer 15, a second blanking layer 16 and a bridging component are arranged in the intersection region of the first electrode 11 and the second electrode 12. The insulating layer is used for preventing the second electrode from getting into contact with the first electrode or with the bridging component. The region where the first blanking layer 15 and the second blanking layer 16 locate corresponds to the region where the bridging component locates, or an area of the first blanking layer 15 and the second blanking layer 16 is no less than an area of the region where the bridging component is, so as to reduce reflectivity of light incident into the region where the bridging component is.

Figure 4:
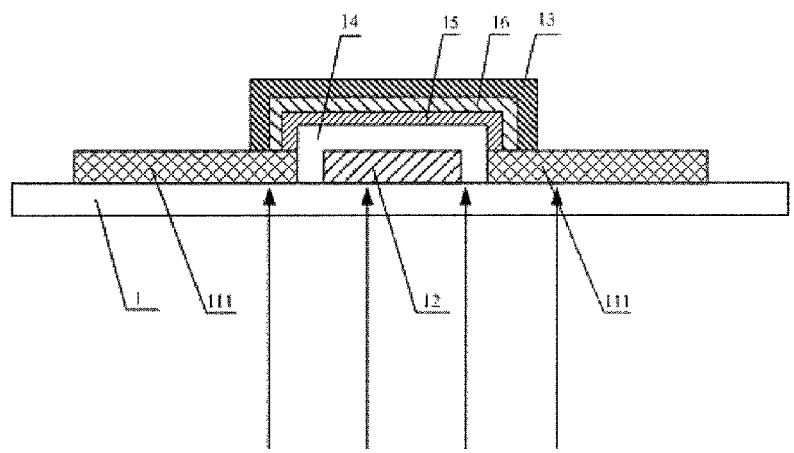
FIG. 4 is a sectional view of the touch screen as shown in FIG. 2 in A-A' direction.
Figure 5:
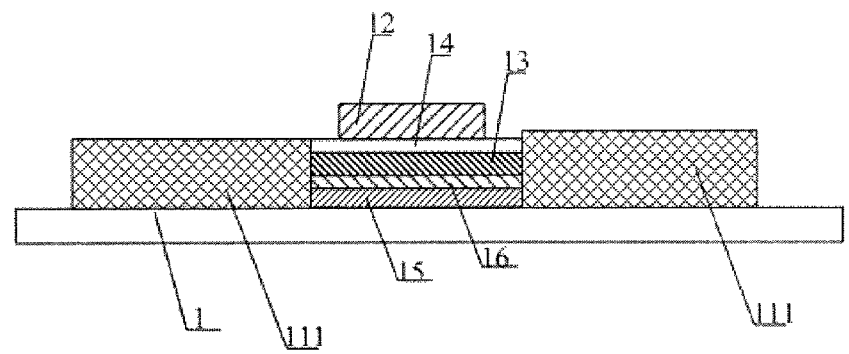
FIG. 5 is a sectional view of the touch screen as shown in FIG. 2 in the A-A' direction.
Figure 6:
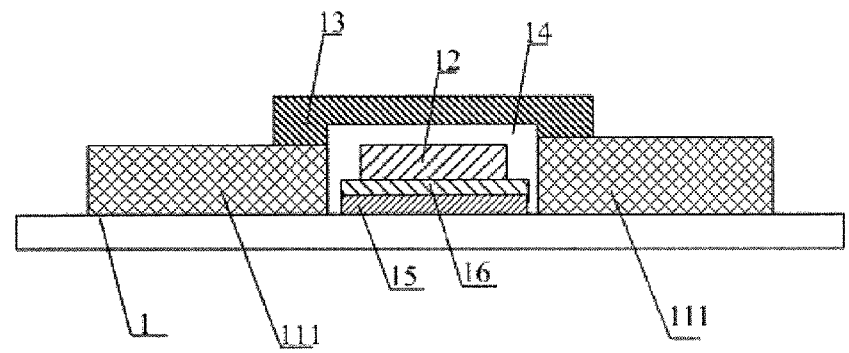
FIG. 6 is a sectional view of the touch screen as shown in FIG. 2 in the A-A' direction.

In order to clearly illustrate relative positions of the bridging component and the respective blanking layers according to the first embodiment of the present invention, detailed description will be made in conjunction with the touch screen as shown in FIG. 4-FIG. 6. FIG. 4-FIG. 6 show sectional views of the touch screen as shown in FIG. 2 in A-A' direction.

FIRST EXAMPLE

Referring to FIG. 4, the touch screen according to the first example comprises: a substrate 1; a first electrode and a second electrode 12 on the substrate 1, arranged in the same layer, wherein the first electrode and the second electrode 12 are disposed to intersect each other, and the first electrode is disconnected into a plurality of first sub-electrodes 111 in a region intersecting with the second electrode 12; an insulating layer 14 on the second electrode 12; a first blanking layer 15 on the insulating layer 14 and a second blanking layer 16 on the first blanking layer 15; and a bridging component 13 on the second blanking layer 16; wherein the insulating layer 14 only covers a region on the second electrode 12 corresponding to the bridging component 13, with proper length and width that can keep the bridging component 13 insulated from the second electrode 12; the first blanking layer 15 and the second blanking layer 16 have the same area and are arranged facing each other; in an example, the area of the first blanking layer 15 is no less than a covering area of the bridging component 13, and a projection of the bridging component 13 on the substrate is within a projection of the first blanking layer 15 or the second blanking layer 16 on the substrate 1; of course, the area of the first blanking layer 15 can be less than the covering area of the bridging component 13, in this case, the projection of the bridging component 13 on the substrate 1 will partially exceed the projection of the first blanking layer 15 or the second blanking layer 16 on the substrate 1.

It should be noted that in the touch screen provided by the embodiment of the present invention, the blanking component is closer to an incident plane of external light compared to the bridging component. As shown in FIG. 4, the incident plane of external light is located on the lower surface of the substrate 1, wherein segments with arrows represent the light. In the touch screen as shown in FIG. 5 and FIG. 6, the external light incident plane is located on the lower surface of the substrate 1, and the incident plane of external light is not shown in FIG. 5 and FIG. 6.

SECOND EXAMPLE

As shown in FIG. 5, the touch screen according to the second example is similar to the touch screen according to the first example in structure, except for that: in the intersection region of the first electrode 11 and the second electrode 12, the first blanking layer 15 and the second blanking layer 16 are arranged below the second electrode 12.

Referring to FIG. 5, the touch screen comprises: a substrate 1; a first electrode on the substrate 1, wherein the first electrode is disconnected into a plurality of first sub-electrodes 111; a first blanking layer 15 and a second blanking layer 16 which are stacked on the first substrate 1, wherein the second blanking layer 16 is provided above the first blanking layer 15; a bridging component 13 above the second blanking layer 16; an insulating layer 14 on the bridging component 13; and a second electrode 12 on the insulating layer 14. The positions and sizes of the first blanking layer 15, the second blanking layer 16, the bridging component 13 and the insulating layer 14 are arranged in a way similar to that of the first example, and thus will not be repeated here.

THIRD EXAMPLE

The touch screen according to the third example has a similar structure with the touch screen as described in the first example, except for that: the second electrode 12 is arranged between the bridging component 13 and the first and second blanking layers 15, 16.

Referring to FIG. 6, the touch screen comprises: a substrate 1, a first electrode on the substrate 1, wherein the first electrode is disconnected into a plurality of first sub-electrodes 111; a first blanking layer 15 and a second blanking layer 16 which are stacked on the substrate 1, wherein the second blanking layer 16 is provided above the first blanking layer 15, and the first blanking layer 15 and the second blanking layer 16 are insulated from the first electrode 11; and a second electrode 12 above the second blanking layer 16; an insulating layer 14 above the second electrode 12, used for insulating the first blanking layer 15 and the second blanking layer 16 from the first electrode 11; and a bridging component 13 above the insulating layer 14, wherein the insulating layer 14 is used for insulating the bridging component 13 from the second electrode 12.

The positions and sizes of first blanking layer 15, the second blanking layer 16, the bridging component 13 and the insulating layer 14 are arranged in a similar way as that defined in the first example, and thus will not be repeated here.

It can be seen from the touch screens according to the first to third examples that the bridging component can be arranged above or below the second electrode depending on the circumstances.

The bridging component can contact or not contact the first blanking layer and the second blanking layer.

The first to third examples provide typical touch screen structures in the first embodiment of the present invention. The touch screens of the respective examples comprise two blanking layers, and the principle of reducing external light reflectivity in the region of the bridging component is similar to the principle as described with reference to FIG. 3, and it will not be repeated here.

Although the blanking component in the touch screens according to the first to third examples includes two blanking layers which are in contact with each other, the blanking component in other embodiments of the present invention can be formed to include more than two blanking layers or formed as multiple metal layers. In the case that the blanking layers and the metal layers are arranged at intervals or in the case that the multiple blanking layers and the multiple metal layers are arranged at intervals, reflectivity of external light can both be reduced in the region of the bridging component.

In the touch screens provided by the first to third examples, the first electrode and the second electrode are transparent electrodes, for example, the first electrode and the second electrode are made from indium tin oxide (ITO), indium zinc oxide (IZO), etc.

In the touch screens provided by the first to third examples, the bridging component can be made from metal or metal alloy, such as molybdenum, aluminum, molybdenum alloy or aluminum alloy; compared to other metals, molybdenum (Mo) or aluminum (Al) is better in stability and is not easy to be oxidized or corroded.

In the touch screen provided by the first to third examples, the respective blanking layers are respectively made from oxide of molybdenum, nitride of molybdenum, oxynitride of molybdenum, oxide of aluminum, nitride of aluminum, oxynitride of aluminum, oxide of molybdenum alloy, nitride of molybdenum alloy, oxynitride of molybdenum alloy, oxide of aluminum alloy, nitride of aluminum alloy, oxynitride of aluminum alloy, etc.

For example, the blanking layers can be made from oxide, nitride, oxynitride of Mo, Al, MoNb, MoTa, MoTi, AlNd, etc. For example, the first blanking layer is $MoNbO_xN_y$, wherein, Mo represents molybdenum metal, Nb is niobium metal, and x and y are integers or decimals; the second blanking layer is $MoNbO_xN_y$, and the first blanking layer and the second blanking layer are different in density.

Some typical metal compounds or alloy compounds are listed above only as the blanking layers. Actually, the respective blanking layers can be any films with different densities, for example, the first blanking layer and the second blanking layer can be made from the same material or different materials, as long as the first blanking layer and the second blanking layer are different in density.

For example, when the bridging component is made from a metal or an alloy, the respective blanking layers are formed to contain oxide, nitride or oxynitride of the at least one metal in the bridging component, or alloy oxide, alloy nitride or alloy oxynitride.

For example, in the first to third examples, the first electrode is a touch driving electrode and the second electrode is a touch sensing electrode; or the first electrode is a touch sensing electrode and the second electrode is a touch driving electrode.

In the touch screens provided by the first to third examples, patterns of the first electrode and the second electrode can be formed by connecting a plurality of rhombus-shaped sub-electrodes in serial or by connecting a plurality of rectangular sub-electrodes in serial; or the second electrode is a strip-shaped electrode.

Figure 7:
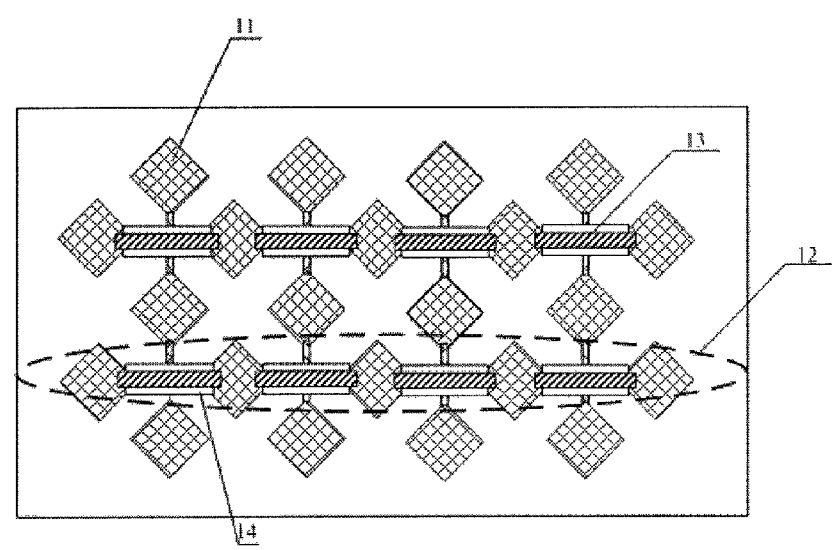
FIG. 7 is a first structural schematic diagram of the first electrodes and the second electrodes in the touch screen according to an embodiment of the present invention.

In the example shown in FIG. 7, the first electrodes 11 and the second electrodes 12 comprise rhombus-shaped sub-electrodes; the first electrode 11 is disconnected at the intersections with the second electrode, and the insulating layer 14 and the bridging component 13 located thereon are provided at the intersections.

Figure 8:
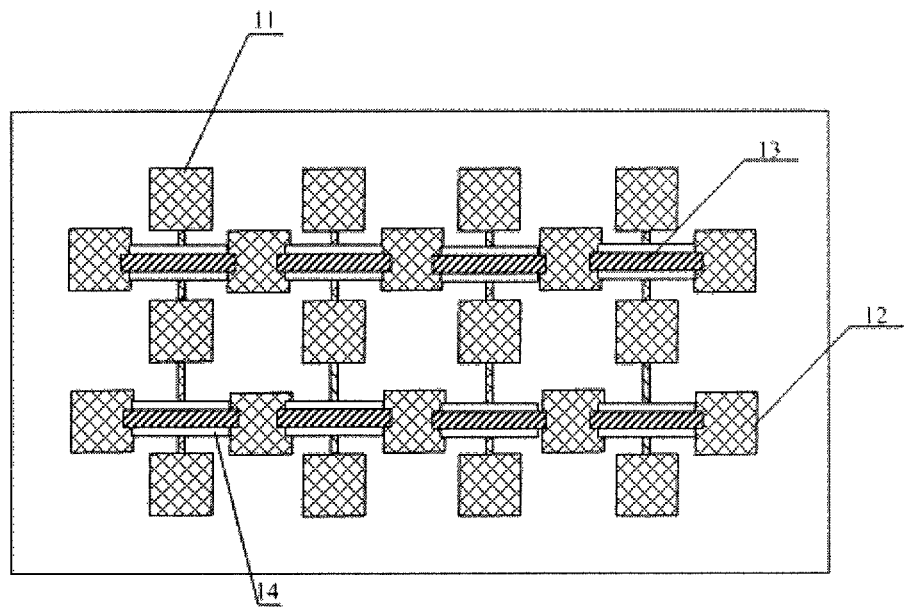
FIG. 8 is a second structural schematic diagram of the first electrodes and the second electrodes in the touch screen according to an embodiment of the present invention.

In the example shown in FIG. 8, the first electrodes 11 and the second electrodes 12 comprise rectangular sub-electrodes; the first electrode 11 is disconnected at the intersections with the second electrodes, and the insulating layer 14 and the bridging component 13 located thereon are provided at the intersections.

Figure 9:
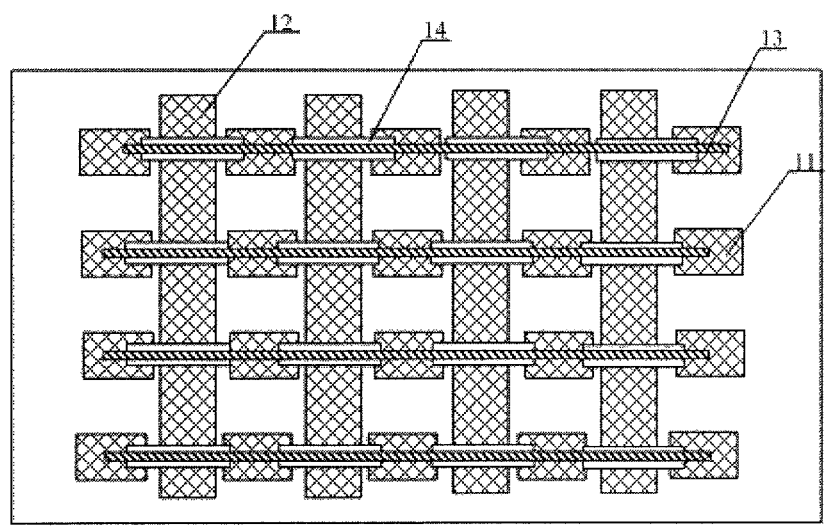
FIG. 9 is a third structural schematic diagram of the first electrodes and the second electrodes in the touch screen according to an embodiment of the present invention.

In the example shown in FIG. 9, the second electrodes 12 are strip-shaped electrodes; the first electrode 11 is disconnected at intersections with the second electrodes, and the insulating layer 14 and the bridging component 13 located thereon are arranged at the intersections. Each of the first electrodes 11 can be provided with one or more bridging components 13 as long as the disconnected first electrode is finally formed to an integral conductive strip.

The first electrodes and the second electrodes in the touch screens provided by all examples above are exemplified as transparent electrodes.

<Second Embodiment>

Figure 10:
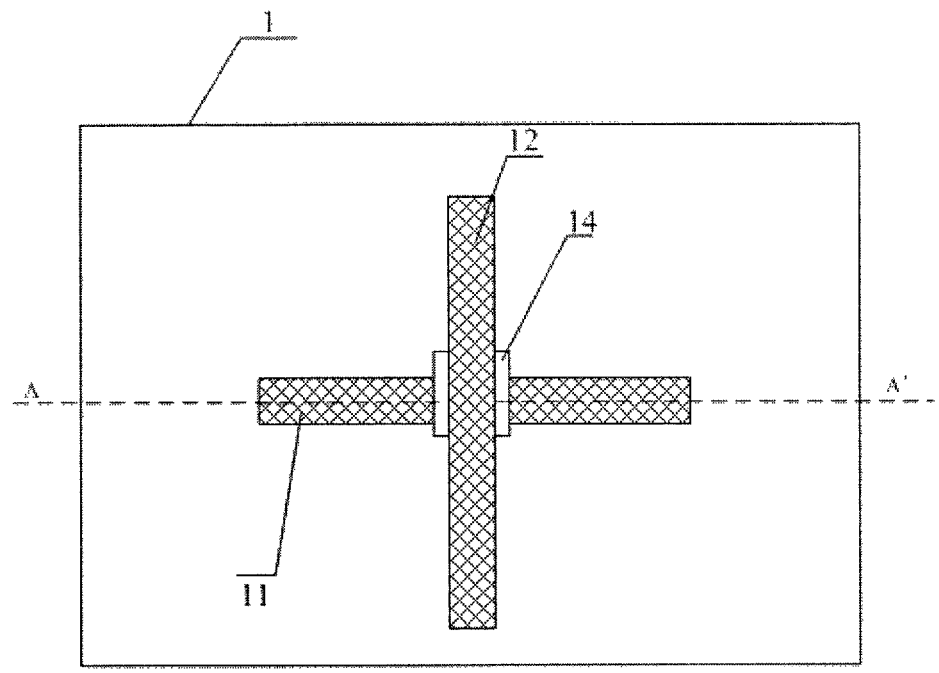
FIG. 10 is a schematic top view of the touch screen according to a second embodiment of the present invention.

Referring to FIG. 10, the touch screen provided by the second embodiment of the present invention comprises: a substrate 1; a plurality of first electrodes 11 extending in a first direction on the substrate 1, and a plurality of second electrodes 12 extending in a second direction and are disposed to intersect the respective first electrodes 11, wherein the first electrode 11 and the second electrode 12 are insulated form each other by an insulating layer at the intersection region; the first electrode 11 is comprised of two stacked blanking layers which are different in density have function of reducing light reflection; and/or the second electrode 12 is comprised of two stacked blanking layers which are different in density and have function of reducing light reflection.

In the touch screen provided by the second embodiment of the present invention, reflection of external light by the touch screen is reduced due to existence of the two blanking layers which are different in density when at least one of the first electrode 11 and the second electrode 12 is comprised of two blanking layers having function of reducing light reflection, which is favorable for realizing invisibility effect of the first electrode 11 and/or the second electrode 12. For example, respective blanking layers are different in density and thus have different absorptions of external light; optical destructive interference resulted form different absorptions can further lead to a reduced reflectivity of the touch screen in corresponding regions of the first electrode 11 and/or the second electrode 12.

<Third Embodiment>

Figure 11:
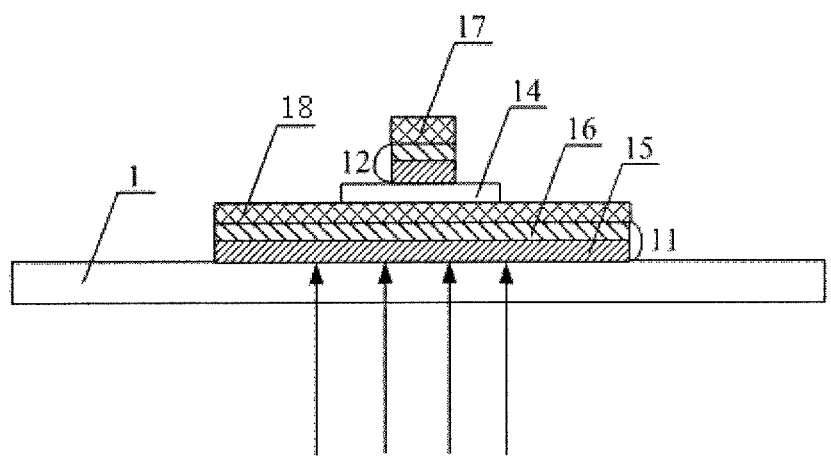
FIG. 11 is a schematic sectional view of the touch screen according to a third embodiment of the present invention.

Referring to FIG. 11, the touch screen provided by the third embodiment has a similar structure as that of the touch screen according to the second embodiment shown in FIG. 10 in structure, except for that: the touch screen shown in FIG. 11 further comprises: a conducting layer 18 and/or 17 in a region corresponding to the first electrode 11 and/or the second electrode 12; the conducting layer 18 and/or 17 is a metal layer or alloy layer, or a film formed by a stack of a metal layer and an alloy layer; the respective blanking layers are close to an incident plane of the external light; and the conducting layer 18 and/or 17, relative to corresponding blanking layer, is away from the incident plane of the external light.

Referring to FIG. 11, for example, the first electrode 11 is formed by a stack of the first blanking layer 15 and the second blanking layer 16, so does the second electrode 12; and the first electrode 11 and the second electrodes 12 are provided with a first conducting layer 18 and a second conducting layer 17 formed thereon respectively;

The first blanking layer 15 of the first electrode 11 is arranged above the substrate 1; the second blanking layer 16 of the first electrode 11 is arranged above the first blanking layer 15 of the first electrode 11; the first conducting layer 18 is arranged above the second blanking layer 16 of the first electrode 11;

The insulating layer 14 is arranged above the first conducting layer 18;

The first blanking layer 15 of the second electrode 12 is arranged above the insulating layer 14; the second blanking layer 16 of the second electrode 12 is arranged above the first blanking layer 15 of the second electrode 12; the second conducting layer 17 is arranged above the second blanking layer 16 of the second electrode 12.

It should be noted that in the touch screen shown in FIG. 11, the external light incident plane is located on the lower surface of the substrate, and in FIG. 11, the plane indicated by the segments with arrow represents the light incident plane.

For example, the respective blanking layers are made from metal oxide, metal nitride, metal oxynitride or alloy oxide, alloy nitride, alloy oxynitride, etc.

For example, the respective blanking layers are made from molybdenum oxide, molybdenum nitride, molybdenum oxynitride, aluminum oxide, aluminum nitride, aluminum oxynitride, molybdenum alloy oxide, molybdenum alloy nitride, a molybdenum alloy oxynitride, aluminum alloy oxide, aluminum alloy nitride, aluminum alloy oxynitride, etc.

For example, the conducting layer can be a metal layer, for example, a molybdenum or aluminum metal layer, etc. The conducting layer can also be an alloy layer, for example, a molybdenum alloy or aluminum alloy layer, etc.

For example, the first blanking layer and the second blanking layer of the first electrodes are identical in area and are arranged corresponding to each other; the first blanking layer and the second blanking layer of the second electrode are identical in area and are arranged corresponding to each other;

As to the first electrode, a projection of the first conducting layer on the substrate is within a projection of the first blanking layer or the second blanking layer on the substrate, or a projection of the first conducting layer on the substrate overlaps with a projection of the first blanking layer or the second blanking layer on the substrate.

As to the second electrode, a projection of the second conducting layer on the substrate is within a projection of the first blanking layer or the second blanking layer on the substrate, or a projection of the second conducting layer on the substrate overlaps with a projection of the first blanking layer or the second blanking layer on the substrate.

In an example, respective first electrodes and respective second electrodes are formed by two patterning processes, for example, the respective first electrodes are formed on the substrate, insulating layers is then provided in intersection regions of the first electrodes and the second electrodes, and the respective second electrodes are finally formed on the substrate, wherein the second electrodes are insulated from the first electrodes by the insulating layers in the regions facing to the first electrodes.

In the touch screens provided by the second embodiment and the third embodiment, respective blanking layers are similar to the respective blanking layers of the touch screens provided by the first embodiment in material, density and structure, and thus will not be described repeatedly here.

In addition, patterns of the first electrodes and the second electrodes provided by the second embodiment and the third embodiment can be similar with that shown in any of FIG. 7-FIG. 9; patterns of the first electrode and the second electrode can be formed by connecting a plurality of rhombus-shaped sub-electrodes in serial or by connecting a plurality of rectangular sub-electrodes in serial, or are strip-shaped electrodes respectively. The difference lies in that the first electrodes 11 provided by the second embodiment and the third embodiment are not disconnected at the intersection with the second electrodes 12, and between the first electrode and the second electrode is only provided an insulating layer, without a bridging component.

Manufacturing methods of touch screens provided by embodiments of the present invention are introduced below.

Manufacturing methods are different for different touch screens.

Firstly, a manufacturing method of a touch screen with a bridging component is described, at least corresponding to the touch screen of the first embodiment. The method mainly comprises the following steps of:

A process of forming a plurality of first electrodes and a plurality of second electrodes disposed to intersect each other on the substrate, wherein the first electrode is disconnected into a plurality of first sub-electrodes in intersection regions with the second electrodes, and both the first electrodes and the second electrodes are transparent electrodes;

A process of forming a bridging component for connecting any two adjacent first sub-electrodes on the substrate, wherein the first sub-electrodes belong to the same first electrode;

Forming a blanking component comprising at least two successive blanking layers differing in density in a region of the substrate corresponding to the bridging component.

For example, the blanking component comprises two blanking layers, i.e., the first blanking layer and the second blanking layer; in this case, for example, the step of forming the blanking component includes:

Simultaneously forming the first electrode and the second electrode on the substrate, so as to simplify the process;

Forming the insulating layer on the substrate with the first electrode and the second electrode formed thereon;

Sequentially forming the first blanking layer and the second blanking layer on the substrate with the insulating layer fainted thereon;

Forming the bridging component on the substrate with the first blanking layer and the second blanking layer formed thereon;

Or for example, the step of forming the blanking component includes:

Sequentially forming the first blanking layer and the second blanking layer on the substrate;

Forming the bridging component on the substrate with the first blanking layer and the second blanking layer formed thereon;

Forming the insulating layer on the substrate with the bridging component formed thereon;

Forming the first electrode and the second electrode on the substrate with the insulating layer formed thereon;

Or for example, the step of faulting the blanking component includes:

Sequentially forming the first blanking layer and the second blanking layer on the substrate;

Forming the first electrode and the second electrode on the substrate with the first blanking layer and the second blanking layer formed thereon;

Forming the insulating layer on the substrate with the first electrode and the second electrode formed thereon;

Forming the bridging component on the substrate with the insulating layer formed thereon, In an example, the step of sequentially forming the first blanking layer and the second blanking layer can be performed, for example, as follows:

forming the first blanking layer through magnetron sputtering in a cavity containing oxygen, nitrogen or mixed gas thereof as a reactant gas and argon as a impinging gas to impact a target material of a first metal or a first alloy;

forming the second blanking layer through magnetron sputtering in a cavity containing oxygen, nitrogen or mixed gas thereof as a reactant gas and argon as a impinging gas to impact a target material of a second metal or a second alloy; wherein when the target materials for forming the first blanking layer and the second blanking layer are same, the gases filled into the cavity for forming the first blanking layer and for forming the second blanking layer are of different types, or they are of the same type but with different ventilation volumes.

For example, in the cavity for magnetron sputtering, there are at least reactant gas ($O_2$ or $N_2$ or mixed gas thereof) and impinging gas (argon Ar) as to impact the target material; the target material is some kind of metal such as at least one metal in the bridging component or metal alloy such as molybdenum-niobium alloy or aluminum-neodymium alloy. Under the action of plasma, film of oxide, nitride or oxynitride of metal is formed, or film of oxide, nitride or oxynitride of alloy is formed.

Another manufacturing method of a touch screen provided by an embodiment of the present invention at least corresponds to the touch screen structure of the second embodiment; the method comprises:

Forming a plurality of first electrodes and a plurality of second electrodes disposed to intersect each other on the substrate, wherein the first electrode and/or the second electrode include at least two stacked blanking layers, and respective blanking layers are different in density and have function of reducing light reflection;

A process of forming an insulating layer for insulating the first electrode and the second electrode in the intersection regions on the substrate.

In an example, the touch screen comprises a first blanking layer and a second blanking layer; in this case, the step of forming the first electrode includes:

Sequentially forming the first blanking layer and the second blanking layer as the first electrode on the substrate according to a pattern of the first electrode;

Forming an insulating layer on the substrate with the first electrode formed thereon;

Forming the second electrode on the substrate with the insulating layer formed thereon.

In an example, the step of forming the second electrode, for example, includes: sequentially forming the first blanking layer and the second blanking layer as the second electrode on the substrate according to a pattern of the second electrode.

In an example, the forming the first blanking layer and the second blanking layer is sequentially performed, for example, as follows:

forming the first blanking layer in a cavity at least containing oxygen, nitrogen or mixed gas thereof by taking metal or alloy as a target material through magnetron sputtering;

forming the second blanking layer in a cavity at least containing oxygen, nitrogen or mixed gas thereof by taking metal or alloy as a target material through magnetron sputtering.

For example, when the target materials for forming the first blanking layer and the second blanking layer are same, the gases filled into cavities for manufacturing the first blanking layer and the second blanking layer are of different types; or they are of the same type but different in ventilation volumes; the steps of sequentially forming the first blanking layer and the second blanking layer is similar to the steps mentioned above of manufacturing the first blanking layer and the second blanking layer, i.e., the magnetron sputtering cavity is filled with at least reactant gas ($O_2$ or $N_2$ or mixed gas thereof) and takes argon Ar as impinging gas to impact the target material; the target in the magnetron sputtering cavity is some kind of metal or metal alloy, for example molybdenum-niobium alloy or aluminum-neodymium alloy or at least one metal in the bridging component. Under action of plasma, film of oxide, nitride or oxynitride of metal is formed, or film of oxide, nitride or oxynitride of alloy is formed.

Another manufacturing method of a touch screen provided by an embodiment of the present invention at least corresponds to the touch screen structure of the third embodiment; the method is basically the same with the manufacturing method of touch screen according to the second embodiment, except for further comprising a process of manufacturing a conducting layer on the first electrode/second electrode.

When the first electrode is comprised of at least two blanking layers, the method further comprises:

Forming a first conducting layer on the first electrode, corresponding to a pattern of the first electrode.

When the second electrode is comprised of at least two blanking layers, the method further comprises:

Forming a second conducting layer on the second electrode, corresponding to a pattern of the second electrodes.

The forming of the first conducting layer and the second conducting layer can be performed by a conventional coating process and the material for forming them is the same with those for forming the first conducting layer and the second conducting layer mentioned in the above embodiments of the present invention, and it will not be repeated here.

It should be noted that the step of forming the blanking layers through magnetron sputtering method is similar to the prior art, except for that the metal or metal alloy mentioned above is taken as target material, and $O_2$, $N_2$ or mixed gas thereof is used as reactant gas.

Two blanking layers differing in density are manufactured through the same coating process if two blanking layers are in contact, i.e., two blanking layers with different densities are formed by controlling reactant gas filled in magnetron sputtering cavity. For example, in order to form the first blanking layer of oxide of molybdenum and niobium, and to form the second blanking layer of oxynitride of molybdenum and niobium, a certain amount of oxygen and nitrogen shall be filled in the magnetron sputtering cavity after the oxide of molybdenum and niobium is formed. Or the blanking layers with different densities are formed by providing a gas from less to much or from much to less.

Generally, besides oxide, nitride or oxynitride of a metal, or oxide, nitride or oxynitride of an alloy formed after reaction of filled gas according to the embodiment of the present invention, the material for the blanking layer can be metal material having a low reflection character or non-metal material having metallic character; the material shall be less than 20% in reflectivity, and shall be excellent in adhesion with metal layer material in contact therewith; the material is low in stress difference and can be etched, and an etching rate of the material has minor difference with metal layer followed. Difference between two metals layers in gas filling amount shall be no less than 5%, for example 5%, 20%, etc.

The touch screen provided by the embodiments of the present invention can be any touch screen with a bridging component. The touch screen is provided with a blanking component corresponding to the bridging component, so as to reduce reflectivity of the bridging component in the touch screen and to achieve an invisibility purpose of the touch screen. Or in the touch screen according to the embodiments of the present invention, the first electrode and the second electrode are metal or alloy, and a blanking component is arranged in a region corresponding to the first electrode and the second electrode. For example, the blanking component includes at least two stacked blanking layers.

It should be noted that the setting of two blanking layers according to the embodiment of the present invention is also applicable to any metal lead wire to be blanked. For example, in the display technical field, a metal lead wire shall be inevitably arranged in the display region, and at least two blanking layers according to the present invention can be arranged above or below the metal lead wire to achieve a blanking effect. For example, the bridging component and the blanking component according to the embodiments of the present invention can be at least applicable to products of a metal grid line structure to be blanked.

An embodiment of the present invention further provides a display device comprising the above touch screen.

In conclusion, the touch screen according to the embodiments of the present invention comprises non-transparent components (such as the first electrode, the second electrode, metal or alloy bridging component or other conducting layers) on the substrate, and a blanking component between the non-transparent components and the external environment. For example, the blanking component comprises two blanking layers with different densities, wherein the blanking layers are made from metal oxide, metal nitride or metal oxynitride. The respective blanking layers, which are made from metal oxide, metal nitride or metal oxynitride with non-metal colors, i.e., slightly grey and black, have better absorption effect of light, so that less external light is reflected out of the touch screen by the non-transparent component, thus reducing light reflectivity. In addition, the respective blanking layers are different in density and different in absorption of external light; and optical blanking action between various reflected light further reduce reflectivity of the touch screen in a corresponding region of the bridging component.

The foregoing embodiments merely are exemplary embodiments of the invention, and not intended to define the scope of the invention, and the scope of the invention is determined by the appended claims.

The invention claimed is:

1. A touch screen, comprising:
a substrate; a plurality of first electrodes extending in a first direction above the substrate; and
a plurality of second electrodes extending in a second direction above the substrate and disposed to intersect the first electrodes;
wherein the first electrode and the second electrode are insulated by an insulating layer in an intersection region; at least one of the first electrode and the second electrode includes a first blanking layer and a second blanking layer, for reducing reflection of external light
wherein, the first electrode is comprised of a first blanking layer and second blanking layer; the second electrode is comprised of another first blanking layer and another second blanking layer; and the first blanking layer, the second blanking layer, the insulating layer, the another first blanking layer and the another second blanking layer are sequentially arranged in a direction away from the substrate.

2. The touch screen according to claim 1, further comprising a conducting layer in a region corresponding to at least one of the first electrode and the second electrode, so that the at least one of the first electrode and the second electrode is located between the conducting layer and the substrate.

3. The touch screen according to claim 1, wherein, the first blanking layer and the second blanking layer are in direct contact and satisfy formulas (1-1) and (1-2):

$$2n_1 d_1 = (2m_1 - 1)\lambda/2 \tag{1-1}$$

$$|2n_1 d_1 - 2n_2 d_2| = (2m_2 - 1)\lambda/2 \tag{1-2}$$

wherein, $n_1$ is refractive index of the first blanking layer, $d_1$ is thickness of the first blanking layer, $m_1$ is any positive integer, $n_2$ is refractive index of the second blanking layer, $d_2$ is thickness of the second blanking layer, $m_2$ is any positive integer, and $\lambda$ is wavelength of ambient light.

4. The touch screen according to claim 1, wherein, the second blanking layer is stacked on the first blanking layer, and an area of the first blanking layer is equal to an area of the second blanking layer.

5. A touch screen, comprising:
a substrate;
a plurality of first electrodes extending in a first direction above the substrate;
a plurality of second electrodes extending in a second direction above the substrate and disposed to intersect the first electrodes, wherein the first electrode and the second electrode are transparent electrodes; the first electrodes are disconnected into a plurality of first sub-electrodes in intersection regions with the second electrodes, and any two adjacent first sub-electrodes within the same first electrode are electrically connected through a bridging component; the bridging component is insulated from the second electrode by an insulating layer; and
a blanking component, at least including a first blanking layer and a second blanking layer for reducing reflection of external light, wherein the first blanking layer and the second blanking layer are different in density; the blanking component is arranged between the substrate and the bridging component; and
the substrate is arranged between the blanking component and an external environment, wherein, the first blanking layer and the second blanking layer are in direct contact and satisfy formulas (1-1) and (1-2):

$$2n_1 d_1 = (2m_1 - 1)\lambda/2 \tag{1-1}$$

$$|2n_1 d_1 - 2n_2 d_2| = (2m_2 - 1)\lambda/2 \tag{1-2}$$

wherein, $n_1$ is refractive index of the first blanking layer, $d_1$ is thickness of the first blanking layer, $m_1$ is any positive integer, $n_2$ is refractive index of the second blanking layer, $d_2$ is thickness of the second blanking layer, $m_2$ is any positive integer, and $\lambda$ is wavelength of ambient light.

6. The touch screen according to claim 5, wherein, a projection of the bridging component on the substrate is within a projection of the blanking component on the substrate.

7. The touch screen according to claim 5, wherein, the second blanking layer is stacked on the first blanking layer, and an area of the first blanking layer is equal to an area of the second blanking layer.

8. The touch screen according to claim 5, wherein, the bridging component is made from single metal or alloy, preferably molybdenum, aluminum, molybdenum alloy or aluminum alloy.

9. The touch screen according to claim 8, wherein, the first blanking layer and/or the second blanking layer are/is made from oxide, nitride or nitrogen oxide of at least one metal contained in the bridging component.

10. The touch screen according to claim 5, wherein, the first blanking layer and/or the second blanking layer are/is made from metal oxide, metal nitride, metal oxynitride, alloy oxide, alloy nitride or alloy oxynitride.

11. The touch screen according to claim 5, wherein, the second electrode, the insulating layer, the first blanking layer, the second blanking layer and the bridging component are sequentially arranged in above-mentioned order in a direction away from the substrate.

12. The touch screen according to claim 5, wherein, the first blanking layer, the second blanking layer, the bridging component, the insulating layer and the second electrode are sequentially arranged in above-mentioned order in a direction away from the substrate.

13. The touch screen according to claim 5, wherein, the blanking component is insulated from the first electrode; and the first blanking layer, the second blanking layer, the second electrode, the insulating layer and the bridging component are sequentially arranged in the above-mentioned order in a direction away from the substrate.

14. The touch screen according to claim 5, wherein, a projection of the bridging component on the substrate is within a projection of the blanking component on the substrate.

15. A manufacturing method of a touch screen, comprising steps of:
   forming a plurality of first electrodes and second electrodes disposed to intersect each other on a substrate; disconnecting the first electrodes in regions intersecting with the second electrode to form a plurality of first sub-electrodes, wherein the first electrodes and the second electrodes are transparent electrodes;
   forming a bridging layer for connecting any two adjacent first sub-electrodes within the same first electrode on the substrate;
   sequentially forming a first blanking layer and a second blanking layer in a region corresponding to the bridging layer on the substrate, for reducing reflection of external light, wherein, the forming the first blanking layer and the second blanking layer includes:
   forming the first blanking layer in a cavity containing oxygen, nitrogen or mixed gas thereof by taking a metal or an alloy as a target material through magnetron sputtering;
   forming the second blanking layer in a cavity containing oxygen, nitrogen or mixed gas thereof by taking a metal or an alloy as a target material through magnetron sputtering;
   wherein the gases filled into the cavity for forming the first blanking layer and the second blanking layer are of different types or are of same type but different in ventilation volume when the target materials for forming the first blanking layer and the second blanking layer are same.

16. The method according to claim 15, wherein, the first blanking layer and the second blanking layer are different in density; and the blanking component is arranged between the substrate and the bridging component.

17. The method according to claim 16, wherein, the forming the first blanking layer and the second blanking layer includes:
   forming the first blanking layer in a cavity containing oxygen, nitrogen or mixed gas thereof by taking a metal or an alloy as a target material through magnetron sputtering;
   forming the second blanking layer in a cavity containing oxygen, nitrogen or mixed gas thereof by taking a metal or an alloy as a target material through magnetron sputtering;
   wherein the gases filled into the cavity for forming the first blanking layer and the second blanking layer are of different types or are of same type but different in ventilation volume when the target materials for forming the first blanking layer and the second blanking layer are same.

\* \* \* \* \*